(12) United States Patent
Sasaki et al.

(10) Patent No.: US 8,067,740 B2
(45) Date of Patent: Nov. 29, 2011

(54) IMAGE SENSOR AND MANUFACTURING METHOD THEREOF

(75) Inventors: Keita Sasaki, Yokohama (JP); Hideyuki Funaki, Tokyo (JP); Hiroto Honda, Yokohama (JP); Ikuo Fujiwara, Yokohama (JP); Koichi Ishii, Kawasaki (JP); Hitoshi Yagi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 139 days.

(21) Appl. No.: 12/508,846

(22) Filed: Jul. 24, 2009

(65) Prior Publication Data

US 2010/0025584 A1 Feb. 4, 2010

(30) Foreign Application Priority Data

Jul. 30, 2008 (JP) ................ 2008-196027

(51) Int. Cl.
*H01L 31/02* (2006.01)
(52) U.S. Cl. ....... 250/338.4; 438/59; 438/130; 438/411; 438/412
(58) Field of Classification Search .............. 438/59, 438/130, 411, 412; 250/338.4
See application file for complete search history.

(56) References Cited

U.S. PATENT DOCUMENTS

| 5,972,758 | A  | * | 10/1999 | Liang ............................ 438/294 |
| 7,119,334 | B2 | * | 10/2006 | Secundo et al. .............. 250/331 |
| 7,361,899 | B2 | * | 4/2008  | Iida ............................ 250/338.4 |
| 2005/0264617 | A1 | * | 12/2005 | Nishimura et al. ............. 347/70 |

OTHER PUBLICATIONS

Yasuhiro Kosasayama, et al., "High sensitive uncooled infrared FPA with SOI diode detectors", ITE Technical Report Vo.32, No. 6, IST Apr. 2008 (Feb. 2008), pp. 21-26.

* cited by examiner

*Primary Examiner* — Constantine Hannaher
(74) *Attorney, Agent, or Firm* — Oblon, Spivak, McClelland, Maier & Neustadt, L.L.P.

(57) ABSTRACT

An image sensor includes a semiconductor substrate; first pixels laid out above cavities provided within the semiconductor substrate, the first pixels converting thermal energy generated by incident light into an electric signal; supporting parts connected between the first pixels and the semiconductor substrate, the supporting parts supporting the first pixels above the cavities; and second pixels fixedly provided on the semiconductor substrate without via the cavities, wherein a plurality of the first pixels and a plurality of the second pixels are laid out two-dimensionally to form a pixel region, and each of the second pixels is adjacent to the first pixels.

15 Claims, 14 Drawing Sheets

IMAGE SENSOR AND MANUFACTURING METHOD THEREOF

CROSS-REFERENCE TO RELATED APPLICATION

This application is based upon and claims the benefit of priority from the prior Japanese Patent Application No. 2008-196027, filed on Jul. 30, 2008, the entire contents of which are incorporated herein by reference.

BACKGROUND OF THE INVENTION

1. Field of the Invention

The present invention relates to an image sensor and manufacturing method thereof.

2. Related Art

An uncooled (thermal) infrared image sensor (hereinafter, simply "sensor") is a device including plural pixels having infrared absorbing layers and thermoelectric conversion elements. Each infrared absorbing layer converts an infrared ray into heat, and each thermal conversion element converts this heat into an electric signal.

The uncooled infrared image sensor thermally isolates an infrared absorbing layer and a thermoelectric conversion element of a certain pixel from other pixels and peripheral circuits, to improve sensitivity. In a sensor mounted in a vacuum package, a cavity is provided between a semiconductor substrate and pixels, thereby supporting the pixels above each cavity. With this arrangement, the pixels are thermally isolated from other pixels and the semiconductor substrate. Because the uncooled infrared image sensor does not require a cooler, this sensor has an advantage of compactness and low cost.

When a cavity is attempted to be formed below pixels by using anisotropic etching such as CDE (Chemical Dry Etching), a cavity is also formed below a thin signal wiring located between adjacent pixels. Therefore, the signal wiring is also consequentially thermally isolated from the semiconductor substrate. That is, a portion below a whole pixel region including plural pixels becomes in a cavity state. In a sensor having many pixels such as a QVGA (Quarter Video Graphics Array), this state weakens mechanical strength of the pixel region, thereby generating a problem in reliability.

According to Kosasayama et al. "High sensitive uncooled infrared FPA with SOI diode detectors" ITE TechnicalReport Vol. 32, No. 6, PP. 21-26, February 2008, an etching stopper film is formed between adjacent pixels by using a DTI (Deep Trench Isolation) process so that a cavity is not formed below the whole pixel region. However, the DTI process requires a fine etching technique, and also has constraints in an etching device and an etching condition, and the like. Therefore, the DTI process cannot be easily performed.

SUMMARY OF THE INVENTION

An image sensor according to an embodiment of the present invention comprises: a semiconductor substrate; first pixels laid out above cavities provided within the semiconductor substrate, the first pixels converting thermal energy generated by incident light into an electric signal; supporting parts connected between the first pixels and the semiconductor substrate, the supporting parts supporting the first pixels above the cavities; and second pixels fixedly provided on the semiconductor substrate without via the cavities, wherein a plurality of the first pixels and a plurality of the second pixels are laid out two-dimensionally to form a pixel region, and each of the second pixels is adjacent to the first pixels.

A method of manufacturing an image sensor, the image sensor according to an embodiment of the present invention, the sendor including first pixels laid out above cavities provided within a semiconductor substrate, and converting thermal energy generated by an incident light into an electric signal, and second pixels having the same configuration as that of the first pixels and fixedly set on the semiconductor substrate, the method comprises: forming thermoelectric converting parts converting thermal energy contained in the first and second pixels into an electric signal in such a manner that the thermoelectric converting parts are embedded into a dielectric film formed on the semiconductor substrate; forming first etching holes at both sides of the thermoelectric converting parts of the first pixels, and simultaneously forming second etching holes at both sides of the thermoelectric converting parts of the second pixels; and forming the cavities below the first pixels while keeping the second pixels set on the semiconductor substrate, by using isotropically etching the semiconductor substrate via the first and second etching holes, wherein an interval L2 between two of the second etching holes at both sides of the thermoelectric converting part is larger than an interval L1 between two of the first etching holes at both sides of the thermoelectric converting part.

DETAILED DESCRIPTION OF THE INVENTION

Embodiments of the present invention will be explained below in detail with reference to the accompanying drawings. Note that the invention is not limited thereto.

First Embodiment

Figure 1:
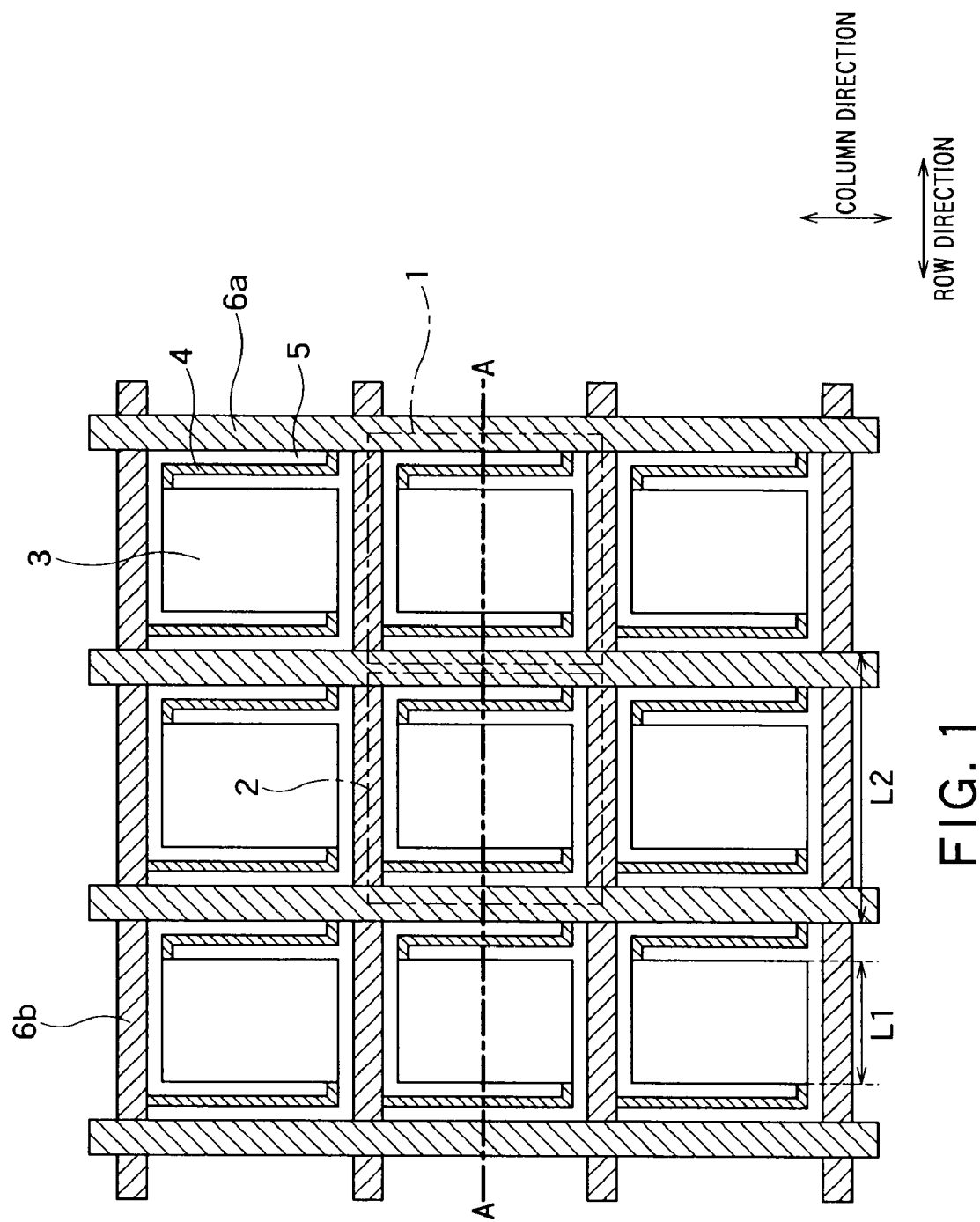
FIG. 1 is a plane view showing an infrared image sensor according to a first embodiment.

FIG. 1 shows a configuration of an uncooled infrared image sensor according to a first embodiment of the present invention. In FIG. 1, an infrared absorbing unit is omitted to facilitate understanding of the entire configuration. A pixel region of the sensor includes valid pixels 1 and reference pixels 2 two-dimensionally arranged in a matrix shape.

Plural signal wirings 6a are extended to a column direction, and plural signal wirings 6b are extended to a row direction. The signal lines 6a and 6b are orthogonal with each other. Each valid pixel 1 as a first pixel includes supporting units 4 and a detection cell 3. The detection cell 3 is configured to convert an infrared signal into an electric signal. Each supporting unit 4 is connected between a semiconductor substrate on which the signal wirings 6a and 6b are formed and the detection cell 3, and supports the detection cell 3 so as to arrange the detection cell 3 above a cavity 8. At the same time, each supporting unit 4 has a wiring inside thereof, thereby electrically connecting between the signal wirings 6a and 6b and the detection cell 3. With this arrangement, a signal detected in the valid pixel 1 can be transmitted to the signal wiring 6a or 6b via the wiring within the supporting unit 4. Further, a voltage to be applied to the valid pixel 1 can be transmitted from the signal wiring 6a or 6b to the valid pixel 1 via the wiring within the supporting unit 4.

Each reference pixel 2 as a second pixel includes the detection cell 3. The reference pixel 2 is fixed onto the semiconductor substrate. Therefore, the supporting unit 4 is not necessary for the reference pixel 2. However, the wiring within the supporting unit 4 is necessary to transmit a reference signal detected in the reference pixel 2 to the signal wiring 6a or 6b, or to transmit a voltage to be applied to the reference pixel 2, from the signal wiring 6a or 6b to the reference pixel 2.

In the reference pixel 2, the detection cell 3 detects a temperature of the semiconductor substrate and the like. Four pixels adjacent to the reference pixel 2 in a column direction and a row direction are all the valid pixels 1. Four pixels adjacent to the reference pixel 2 in a diagonal direction of the pixel region are all the valid pixels 1. That is, in the first embodiment, eight pixels around the reference pixel 2 are all the valid pixels.

Figure 2:
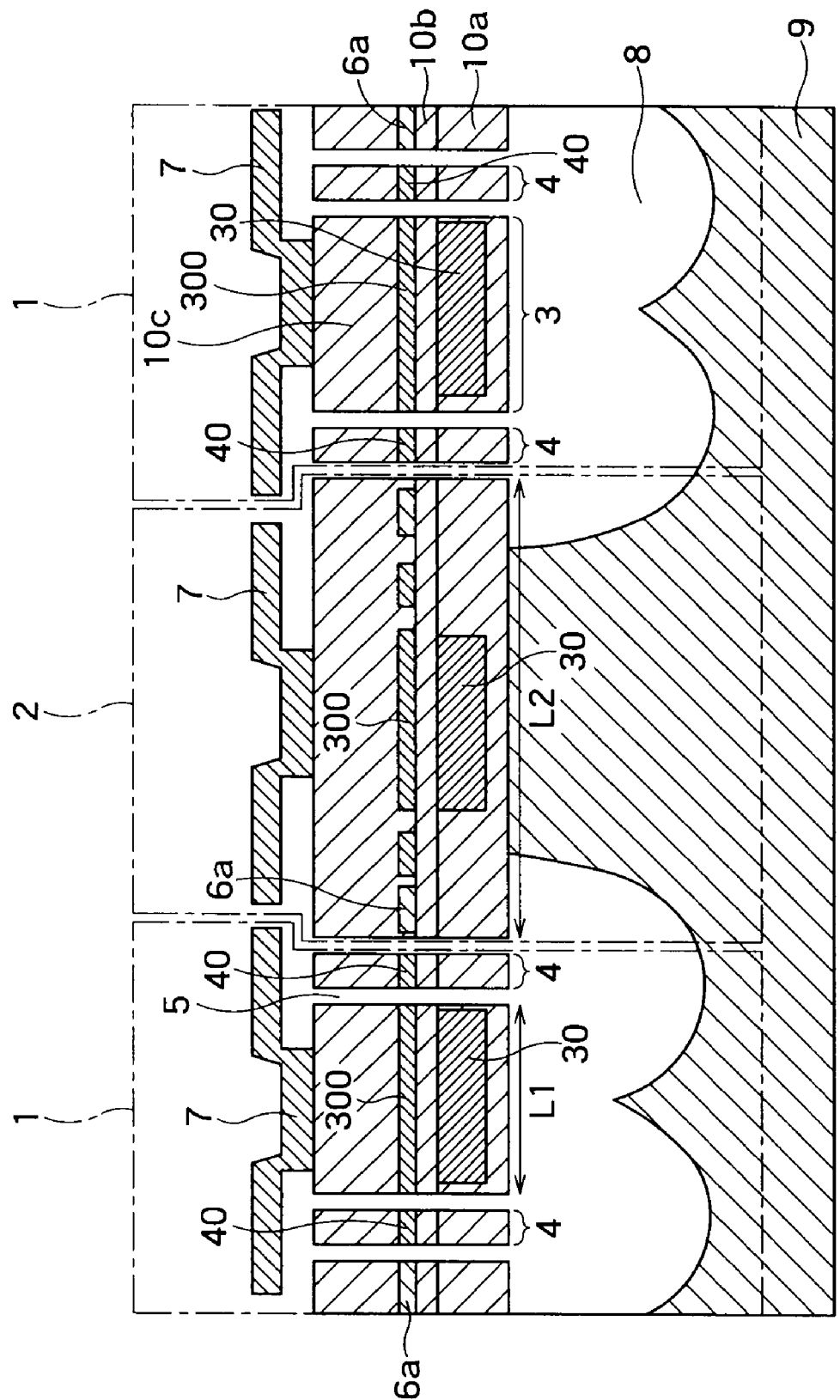
FIG. 2 is a cross-sectional view showing the infrared image sensor according to the first embodiment.

A cross-sectional view of FIG. 2 along a line A-A in FIG. 1 shows the reference pixel 2 and two of the valid pixels 1 arranged at both sides of the reference pixel 2. The cavities 8 are provided within a semiconductor substrate 9. The valid pixels 1 are arranged above the cavities 8. As shown in FIG. 1, the valid pixels 1 are connected to the semiconductor substrate 9 by the supporting units 4, and are supported above the cavities 8.

Each valid pixel 1 includes the detection cell 3. The detection cell 3 includes a thermoelectric converting unit 30, a cell wiring 300, and protection dielectric films 10a to 10c. The protection dielectric films 10a to 10c cover the thermoelectric converting unit 30 and the cell wiring 300. While the thermoelectric converting unit 30 and the cell wiring 300 are electrically conductive to each other, a connection part connecting between the thermoelectric converting unit 30 and the cell wiring 300 is not shown in FIG. 2.

An infrared absorbing unit 7 is formed in an umbrella shape to cover above the detection cell 3 and the signal wirings 6a and 6b. The infrared absorbing unit 7 is formed by insulation materials such as a silicon oxide film and a silicon nitride film. The infrared absorbing unit 7 is thermally connected to the detection cell 3. The infrared absorbing unit 7 absorbs an incident infrared ray, and converts this infrared ray into thermal energy.

Because this sensor is finally set to a vacuum state, a gap between the supporting unit 4 and the detection cell 3 and the inside of the cavity 8 are in vacuum. That is, while the detection cell 3 is connected to the semiconductor substrate 9 by the supporting unit 4, other portions of the detection cell 3 are isolated from the semiconductor substrate 9 via the vacuum cavity 8. Accordingly, thermal insulation and sensitivity of the detection cell 3 are improved.

The signal wirings 6a and 6b are covered by protection dielectric films 10a to 10c. The signal wiring 6a and the signal wiring 6b are insulated by the protection dielectric films 10a to 10c at intersections between these signal wirings. One valid pixel 1 and one reference pixel 2 are arranged in each region surrounded by the signal wirings 6a and 6b.

The supporting units 4 and the detection cell 3 are arranged above the cavity 8. The cavity 8 is formed by isotropically etching the semiconductor substrate 9 via etching holes 5 using a dry etching process such as CDE (Chemical Dry Etching) or the like.

Each supporting unit 4 is formed in a zigzag shape. One end of the supporting unit 4 is connected to the signal wiring 6a or 6b, and the other end of the supporting unit 4 is connected to the detection cell 3. The detection cell 3 is supported by only the supporting unit 4 in a buoyant state above the cavity 8. The supporting unit 4 includes a wiring 40 covered by the protection dielectric films 10a to 10c. One end of the wiring 40 is electrically connected to the signal wiring 6a or 6b, and the other end of the wiring 40 is electrically connected to the detection cell 3.

The semiconductor substrate 9 is present between adjacent two cavities 8. The reference pixel 2 is provided on the semiconductor substrate 9. The reference pixel 2 is different from the valid pixel 1 in that the etching holes 5 and the cavity 8 are not provided in the reference pixel 2. Other configurations of the reference pixel 2 can be the same as those of the valid pixel 1.

Because the etching holes 5 are not provided in the reference pixel 2, the cavity 8 is not formed below the detection cell 3 of the reference pixel 2. That is, the semiconductor substrate 9 is present below the detection cell 3 of the reference pixel 2, and the reference pixel 2 is directly fixed onto the semiconductor substrate 9.

Because the etching holes 5 are not present in the reference pixel 2, the semiconductor substrate 9 below the reference pixel 2 is cut by some extent by side etching from the etching holes 5 of the valid pixel 1 adjacent to the reference pixel 2 to a lateral direction. In this case, when an etching amount X is set as $L1/2 < X < L2/2$, the reference pixel 2 can be maintained in a state of being partially connected to the semiconductor substrate 9. L1 represents a width in a lateral direction of the detection cell 3 of the valid pixel 1, and L2 represents a width in a lateral direction of the detection cell 3 of the reference pixel 2. The lateral direction means a direction parallel with a front surface of the semiconductor substrate 9, and includes a column direction and a row direction. FIG. 2 shows only a row direction. Because the reference pixel 2 is actually also adjacent to the valid pixel 1 in a column direction, a similar relation can be also applied to the column direction.

A gap is not provided between the reference pixel 2 and the supporting unit 4. Therefore, the detection cell 3 of the reference pixel 2, the supporting units 4, and the signal wirings 6a and 6b are integrally sealed by the protection dielectric films 10a to 10c. An integrally formed configuration is assumed to be the detection cell 3 of the reference pixel 2, for the sake of convenience.

The thermoelectric converting unit 30 included in the valid pixel 1 and the reference pixel 2 has a pn junction. The thermoelectric converting unit 30 converts thermal energy of the infrared absorbing unit 7 into an electric signal by using temperature dependence of a forward direction characteristic of the pn junction. In this case, when a current is constant, the thermoelectric converting unit 30 outputs a forward voltage dependent on thermal energy. When a voltage is constant, the thermoelectric converting unit 30 outputs a forward current dependent on the thermal energy.

Assume that $I_{light}$ represents power of an infrared ray per unit area, γ represents absorption efficiency, $A_D$ represents an infrared absorption area per unit pixel, $G_{th}$ represents thermal conductance from the detection cell 3 to the semiconductor substrate 9, and dV/dT represents a thermoelectric conversion coefficient of a pn junction. Then, an output signal of the thermoelectric converting unit 30 is expressed by Expression 1.

$$(I_{light}A_D/G_{th})(dV/dT) \qquad \text{(Expression 1)}$$

As is clear from the Expression 1, sensitivity of the infrared sensor is inversely proportional to the thermal conductance $G_{th}$ between the detection cell 3 and the semiconductor substrate 9. Because the valid pixel 1 is thermally insulated from the semiconductor substrate 9, it is clear that the valid pixel 1 has improved sensitivity as an infrared sensor element. Because the reference pixel 2 is thermally connected to the semiconductor substrate 9, it is clear that the reference pixel 2 outputs a signal dependent on a temperature of the semiconductor substrate 9. That is, the reference pixel 2 functions as what is called a thermal black pixel.

In the first embodiment, plural valid pixels 1 are adjacent to one reference pixel in a column direction or a row direction. This means that the reference pixel 2 is provided at not an end of a pixel region but at an inner side of the end. Further, at least a part of a bottom surface of the reference pixel 2 is fixed onto the semiconductor substrate 9. Therefore, a portion where the reference pixel 2 is arranged has a function of a pillar supporting the cavity 8. As a result, mechanical strength of the pixel region is improved.

When the reference pixels 2 are scattered within the pixel region, an accurate reference signal near the valid pixel 1 can be obtained. The reference signal is an electric signal from a pixel in a black state that there is no incident infrared ray, and a signal showing a DC component or a noise component due to a temperature or the like of the semiconductor substrate. Because the reference pixels 2 are arranged on the semiconductor substrate 9, a temperature of the thermoelectric converting unit 30 of each reference pixel 2 is substantially equal to a temperature of the semiconductor substrate 9 near the valid pixel 1. Therefore, the reference pixel 2 can output an accurate reference signal. Accordingly, in the first embodiment, a valid and accurate signal corresponding to an incident infrared ray can be obtained by subtracting the reference signal from an electric signal of the valid pixel 1.

To interpolate image signals at portions of the reference pixel 2, a pixel adjacent to the reference pixel 2 is preferably the valid pixel 1. For example, when four pixels adjacent to the reference pixel 2 in a column direction and a row direction are all the valid pixels 1, image signals at portions of the reference pixel 2 can be easily interpolated. Further, when eight pixels around the reference pixel 2 are all the valid pixels 1, image signals at portions of the reference pixel 2 can be easily interpolated. Image signals at portions of the reference pixel 2 can be of course interpolated by setting only two pixels adjacent to the reference pixel 2 in a column direction or a row direction to the valid pixels 1.

A method of manufacturing a sensor according to the first embodiment is explained next.

Figure 3:
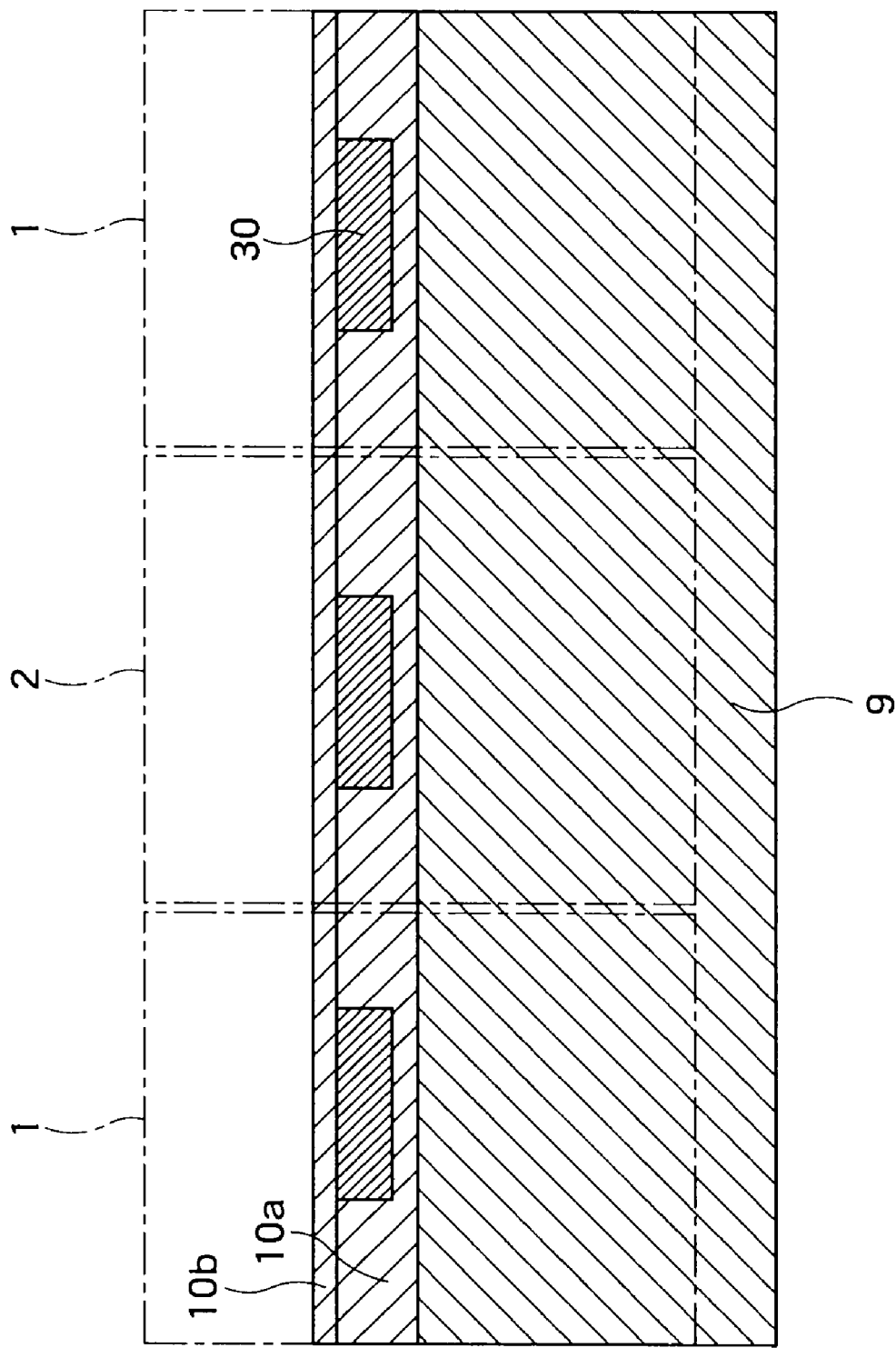
FIGS. 3 to 7 are cross-sectional views showing a manufacturing method of the infrared image sensor according to the first embodiment.

As shown in FIG. 3, the dielectric film 10a is first deposited on the semiconductor substrate 9, and the thermoelectric converting units 30 are formed on the dielectric film 10a. The dielectric film 10b is formed to cover the thermoelectric converting units 30. With this arrangement, the thermoelectric converting units 30 are formed to be embedded into the dielectric films 10a and 10b. When an SOI substrate is used for the semiconductor substrate 9, an embedded oxide film (BOX) of the SOI substrate can be used for the dielectric film 10a. In this case, the thermoelectric converting units 30 are formed in the SOI layer.

Each thermoelectric converting unit 30 includes a pn diode formed on monocrystal silicon, for example. The dielectric film 10b is a silicon oxide film, for example, and works as an element isolation region. The dielectric films 10a and 10b protect the thermoelectric converting unit 30.

Figure 4:
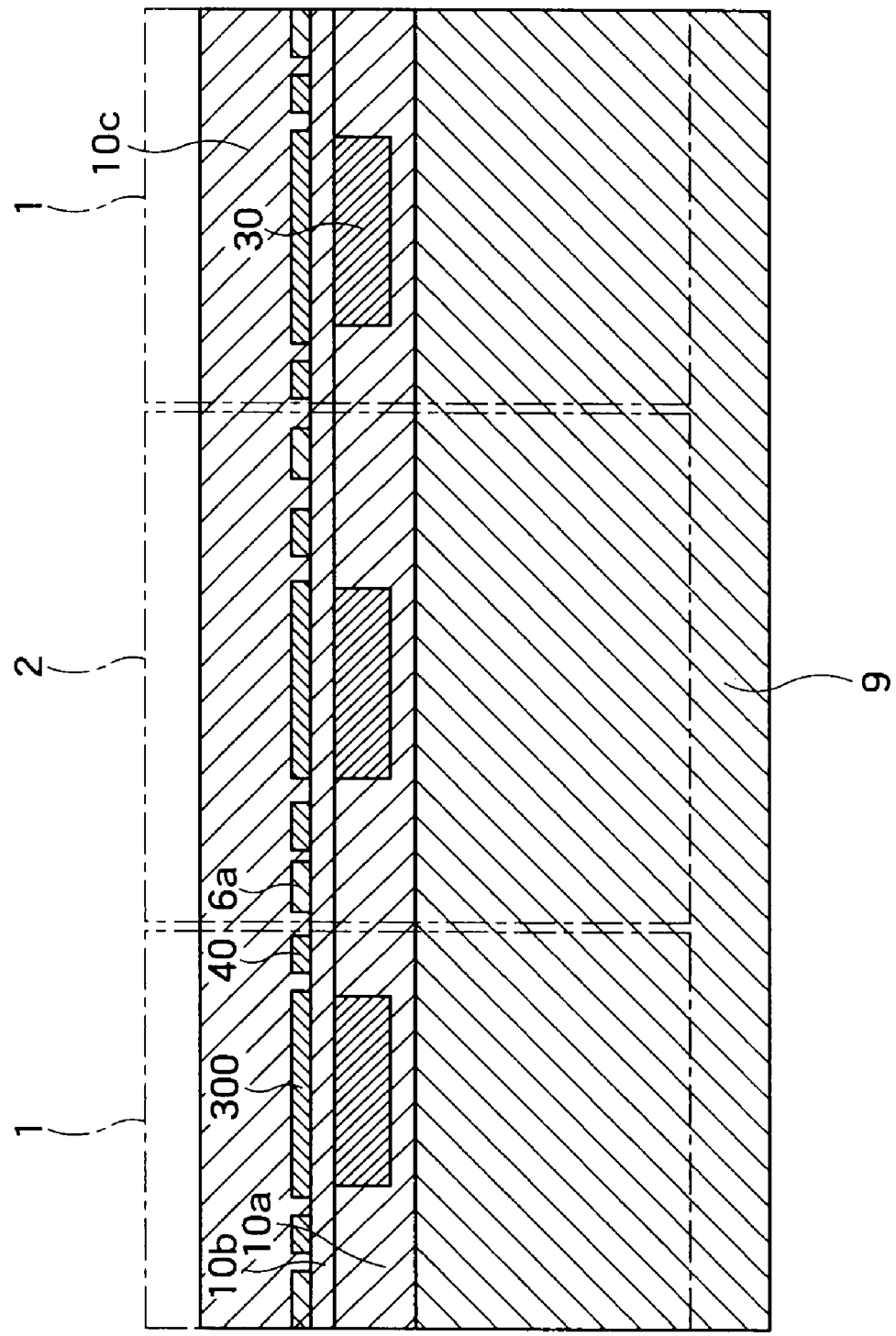

Plural signal wirings 6b (see FIG. 1) are then formed on the dielectric film 10b. Dielectric films (not shown) are formed to cover the signal wirings 6b. As shown in FIG. 4, the signal wiring 6a, the cell wiring 300, and the supporting wiring 40 are formed by plural numbers on these dielectric films. Accordingly, the signal wirings 6a and 6b are formed in a mutually insulated state. The signal wirings 6a, the cell wirings 300, and the supporting unit wirings 40 are covered by the dielectric film 10c. The dielectric films 10a to 10c function as protection dielectric films of the signal wirings 6a, the cell wirings 300, and the supporting wirings 40.

Figure 5:
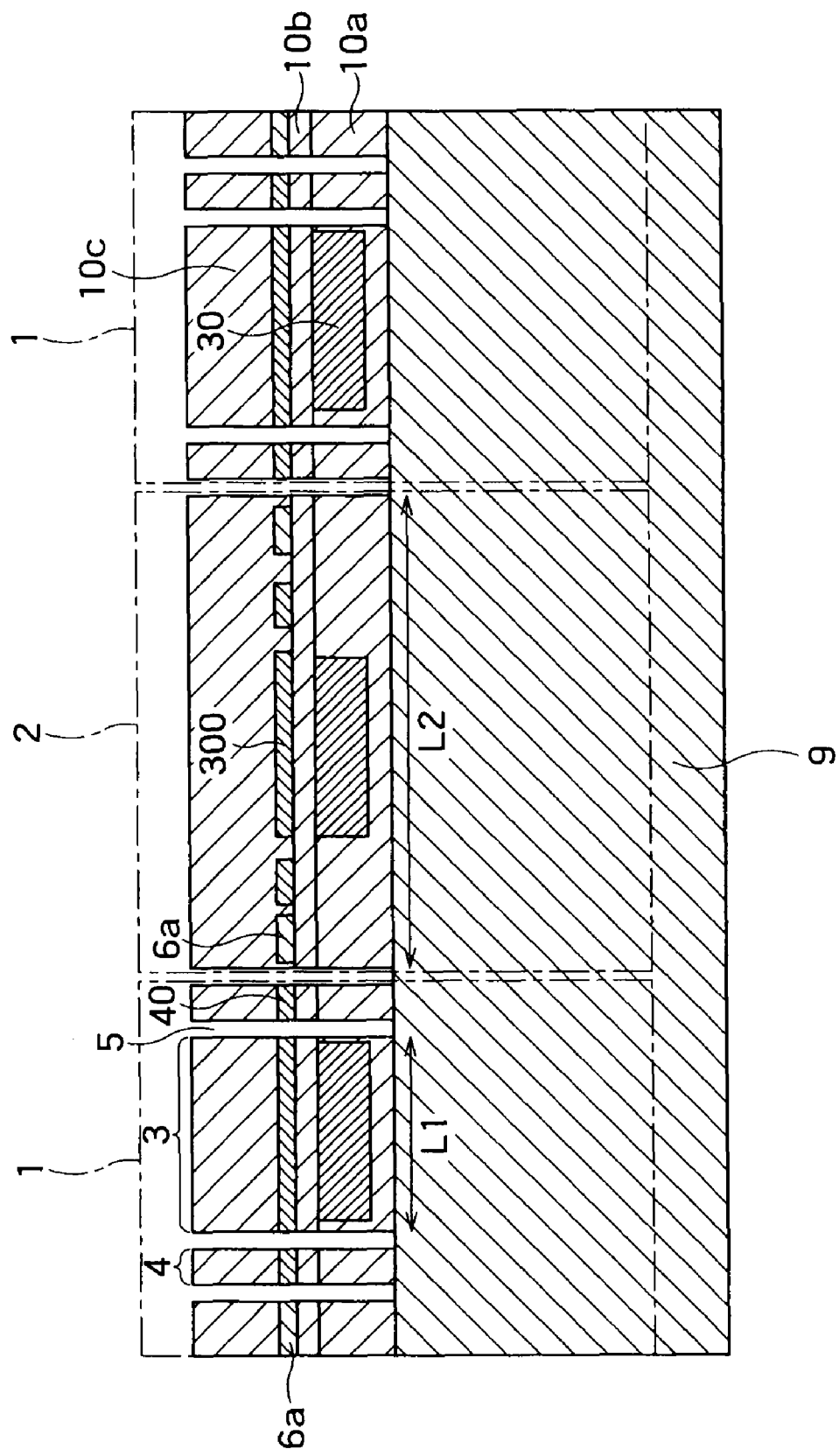

Next, as shown in FIG. 5, the etching holes 5 are formed by etching the protection dielectric films 10a to 10c by using anisotropic etching such as RIE (Reactive Ion Etching) or the like. The etching holes 5 are formed to reach the front surface of the semiconductor substrate 9 piercing through the protection dielectric films 10a to 10c. The etching holes 5 are formed to form the cavity 8 below each valid pixel 1. By a process of forming the etching holes 5, the supporting units 4 are patterned, and the supporting units 4 are isolated from the detection cells 3 and the signal wirings 6a and 6b. However, to support the detection cells 3, one end of the supporting unit 4 is connected to the detection cell 3, and the other end of the supporting unit 4 is connected to the signal wiring 6a or 6b (see FIG. 1). Further, by a process of forming the etching holes 5 (a patterning process of the supporting unit 4), a size of the detection cell 3 and a width of the supporting unit 4 are determined.

An interval between two of the etching holes 5 formed at both sides of the detection cell 3 of the valid pixel 1 is set as L1. That is, L1 corresponds to a width of the detection cell 3 of the valid pixel 1, and L2 corresponds to a width of the detection cell 3 of the valid pixel 2. An interval between two of the etching holes 5 formed at both sides of the detection cell 3 of the reference pixel 2 is set to L2. Because the reference pixel 2 is directly fixed onto the semiconductor substrate 9, L2 needs to be larger than L1.

An upper part of the protection dielectric film 10c on the supporting unit 4 can be etched using anisotropic etching such as RIE. This is because thermal conductance of the supporting unit 4 can be decreased by this etching.

Figure 6:
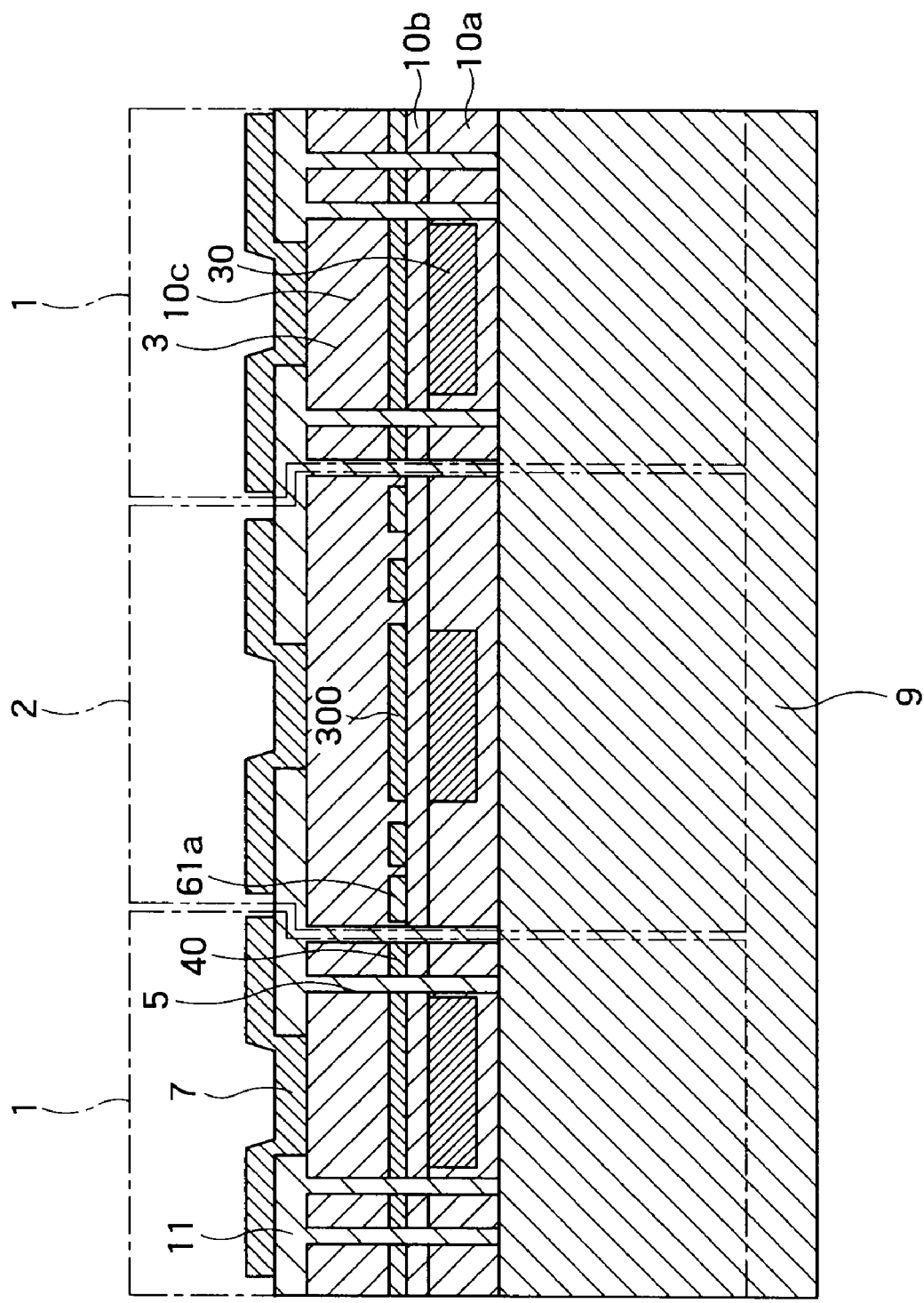

Next, as shown in FIG. 6, sacrificial layers 11 are formed by deposition to embed the etching holes 5. The sacrificial layers 11 on the detection cells 3 are removed to expose an upper surface of the detection cells 3. A dielectric film is deposited on the exposed detection cells 3, to pattern the dielectric film. With this arrangement, the infrared absorbing units 7 including the dielectric films are formed on the detection cells 3 and the sacrificial layers 11. The infrared absorbing units 7 include insulation materials such as a silicon oxide film and a silicon nitride film. However, the infrared absorbing units 7 can include an optional material as long as this material has a characteristic of absorbing infrared rays (up to 10 μm).

Figure 7:
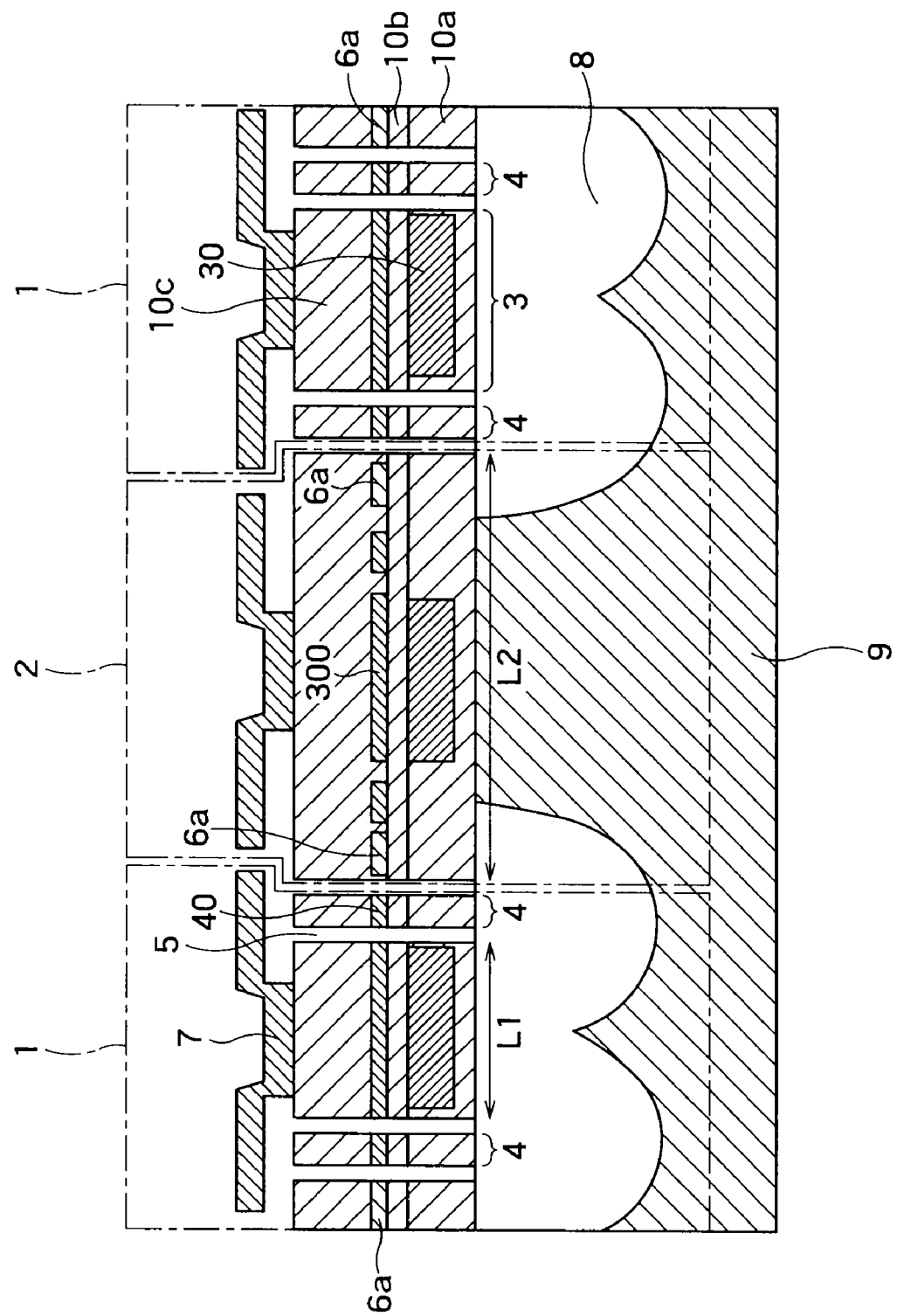

Next, as shown in FIG. 7, the sacrificial layers 11 are removed to form the infrared absorbing units 7 in umbrella structures. The infrared absorbing units 7 are in contact with only the protection dielectric films 10 on the upper surfaces of the detection cells 3. The infrared absorbing units 7 are isolated for each pixel. The sacrificial layers 11 are also removed from the inside of the etching holes 5. Accordingly, the semiconductor substrate 9 is exposed at bottom surfaces of the etching holes 5.

The semiconductor substrate 9 is isotropically etched through the etching holes 5 using CDE. An etching amount of the semiconductor substrate 9 is equal to or larger than L1/2 and smaller than L2/2. When this condition is satisfied, cavities etched from the plural etching holes 5 at both sides of each detection cell 3 of the valid pixels 1 are connected below the valid pixels 1. Accordingly, the cavities 8 are formed below the detection cells 3 of the valid pixels 1. The detection cells 3 of the valid pixels 1 become in a configuration buoyant in the air, and are practically thermally isolated from the semiconductor substrate 9.

On the other hand, because the etching amount of the semiconductor substrate 9 is smaller than L2/2, cavities etched from the plural etching holes 5 at both sides of each detection cell 3 of the reference pixels 2 are not connected below the reference pixels 2. Therefore, the semiconductor substrate 9 remains in a pillar shape below each reference pixel 2. The detection cells 3 of the reference pixels 2 remain thermally connected to the semiconductor substrate 9.

In the first embodiment, a shape of each supporting unit 4 is not limited to a zigzag shape. Each supporting unit 4 is connected to the signal wiring 6a or the signal wiring 6b near an intersection between the signal wiring 6a and the signal wiring 6b. However, the supporting unit 4 can be connected to an optional position of the signal wiring 6a or the signal wiring 6b.

(Layout Example 1 of Reference Pixels 2)

Figure 8:
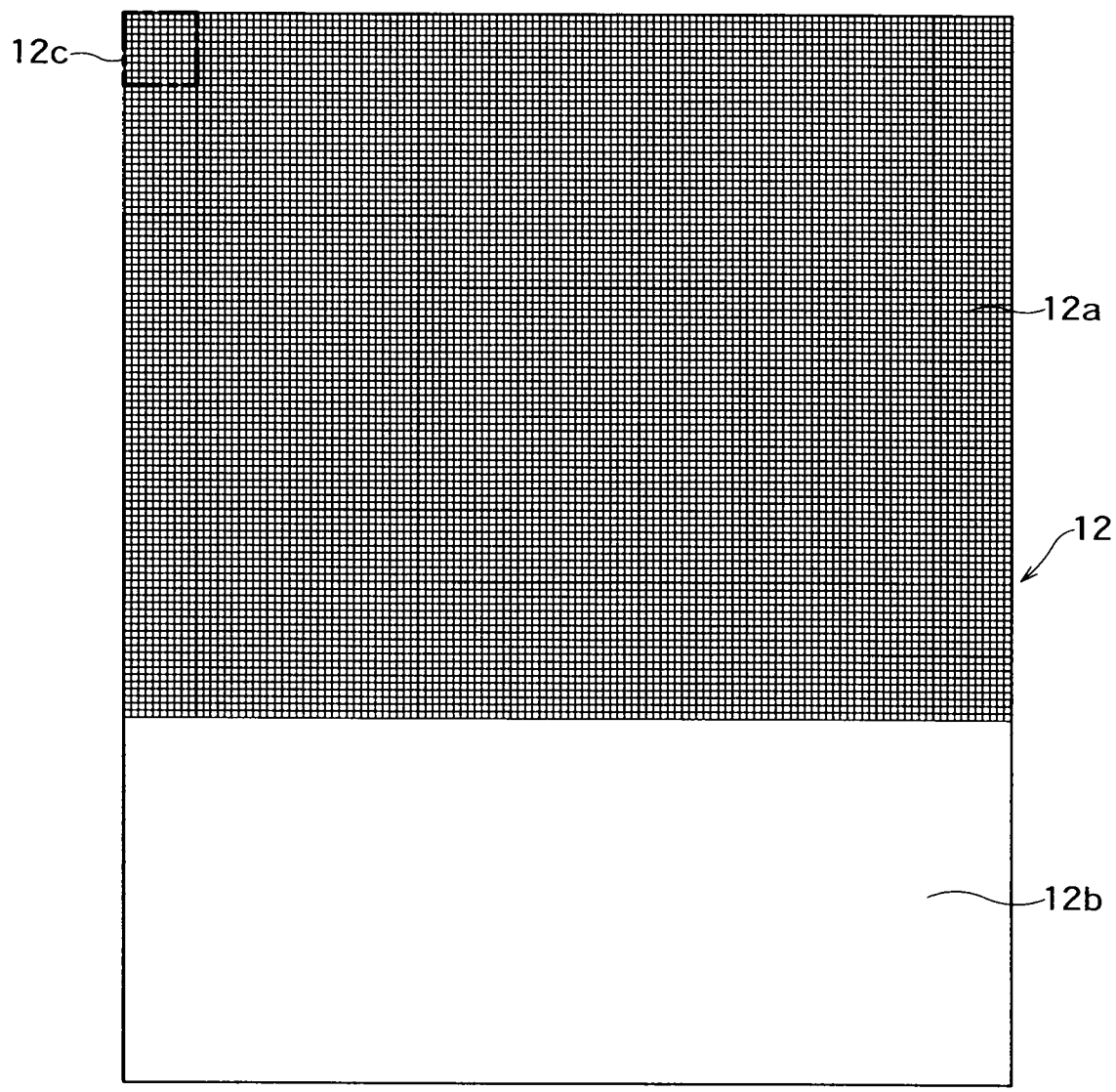
FIG. 8 is a plane view showing an example of an arrangement of the reference pixels.
Figure 9:
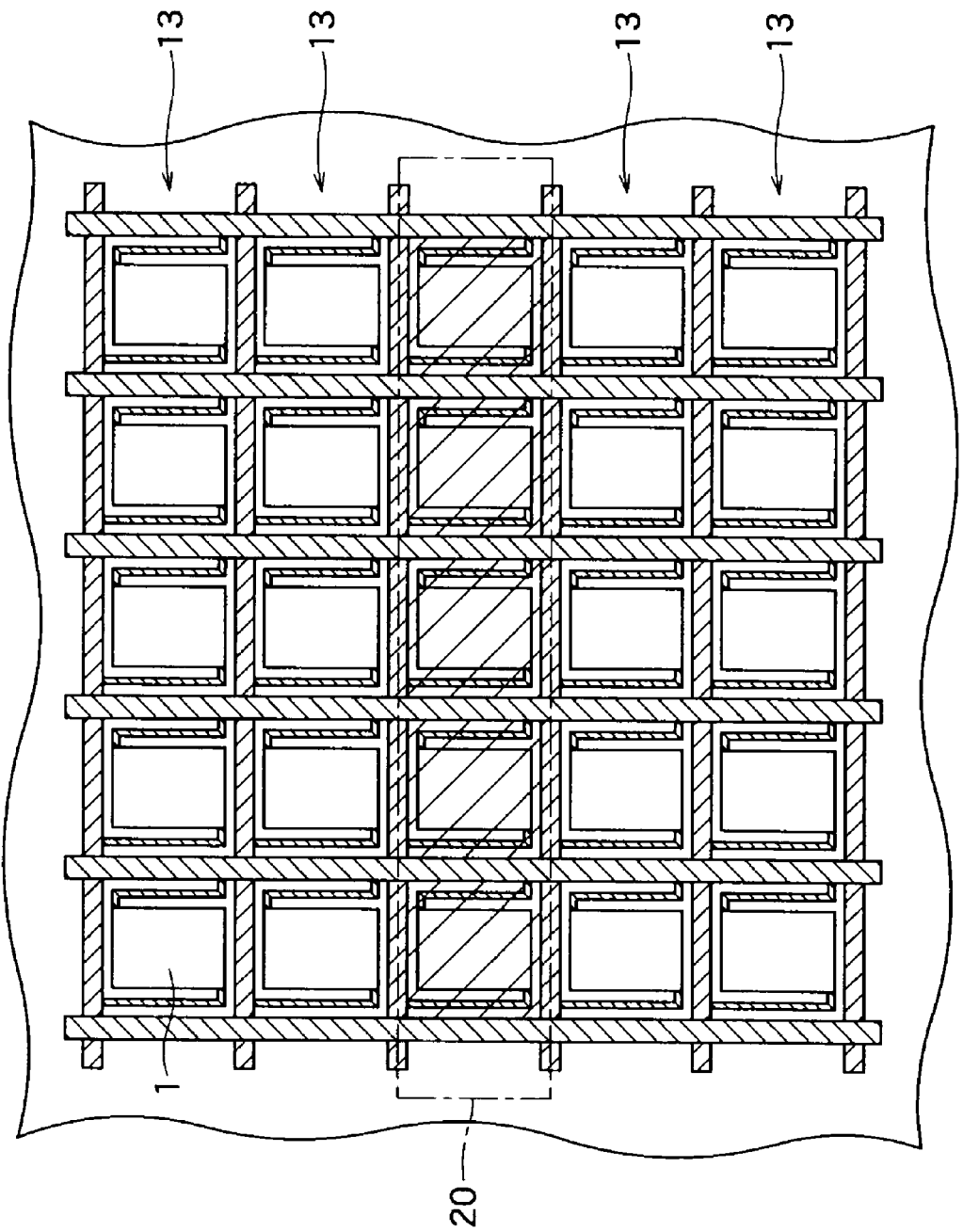
FIG. 9 shows a pixel region 12c showing an enlarged part of the pixel region 12a in FIG. 8.

A detailed layout example of the reference pixels 2 in the first embodiment is explained. An infrared image sensor chip 12 shown in FIG. 8 includes a pixel region (an image area) 12a, and a peripheral circuit 12b controlling the pixel region 12. FIG. 9 shows a pixel region 12c showing an enlarged part of the pixel region 12a in FIG. 8. The pixel region 12c includes pixels in five rows and five columns laid out in an array shape.

A frame 20 shown in FIG. 9 is a reference pixel row 20 having the reference pixels 2 arranged. Remaining rows are valid pixel rows 13 including valid pixels 1. That is, out of the five rows, the whole one row includes the reference pixels 2. The reference pixels 2 are laid out in a line shape in a row direction. The image area 12a in FIG. 8 is formed by repeating a plane configuration shown in FIG. 9. Therefore, the reference pixel row 20 appears at every five rows in the cell array. For example, in the case of a QVGA, the plane configuration shown in FIG. 9 is laid out repeatedly by 64 in a horizontal direction and by 48 in a vertical direction.

In the first embodiment, the reference pixel row 20 is arranged at every five rows. However, a layout interval of the reference pixel rows 20 can be smaller or larger by taking into account stress distortion and mechanical strength of the pixel region. A layout of the reference pixel rows 20 can be easily changed by changing a mask used in a formation process of the etching holes 5.

An S/N (Signal-to-Noise ratio) of the infrared image sensor is improved based on the layout of the reference pixel rows 20 in the first embodiment. This is explained with reference to FIG. 10 and FIG. 11. Because the reference pixels 2 are connected to the semiconductor substrate 9, output signals (reference signals) from the reference pixels 2 show a current-voltage characteristic reflecting a temperature of the semiconductor substrate 9. By taking a differential signal between output signals (valid signals) from the valid pixels 1 and the reference signals, infrared signals excluding influence to a substrate temperature can be detected.

Figure 10:
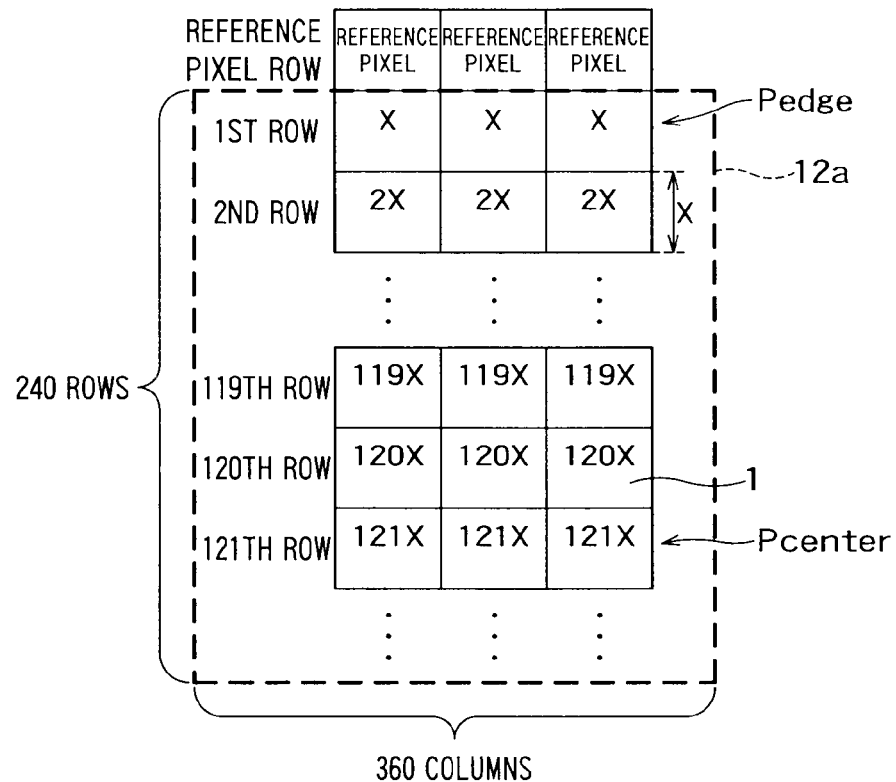
FIG. 10 is a plane view of a pixel region showing an arrangement of a conventional reference pixels.

As shown in FIG. 10, conventionally, the reference pixels 2 are arranged outside the pixel region (image area). In this case, a distance between the valid pixels 1 actually detecting infrared rays and the reference pixels 2 detecting a thermal black state is large. That a distance between the valid pixels 1 and the reference pixels 2 is large means that the reference pixels 2 cannot output a reference signal based on temperatures of the valid pixels 1. A variation of distances between the valid pixels 1 and the reference pixels 2 is also large. Usually, the semiconductor substrate 9 has a temperature distribution within the substrate, and has variances of temperatures depending on positions of the substrate. Therefore, that the distance between the valid pixels 1 and the reference pixels 2 is large means that the reference pixels 2 cannot output reference signals corresponding to the temperature distribution.

In the case of the QVGA, for example, even when the reference pixels 2 are arranged to surround an image area, a distance between valid pixels $P_{center}$ at a center of the image area and the reference pixels becomes about 120 times a pixel pitch X. A distance between valid pixels $P_{edge}$ at an end of the image area and the reference pixels is about one time the pixel pitch X. Therefore, the reference pixels 2 cannot output reference signals by accurately reflecting temperatures of the valid pixels 1, and cannot output reference signals corresponding to the temperature distribution of the semiconductor substrate 9.

Figure 11:
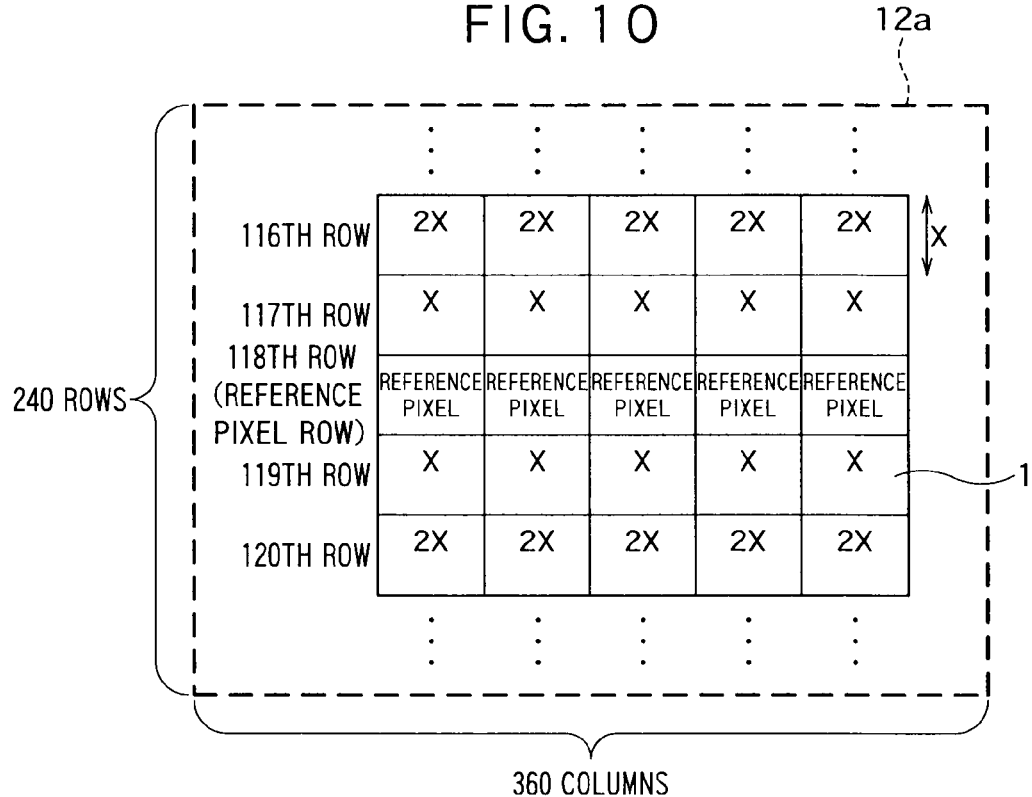
FIG. 11 is a plane view of a pixel region showing an arrangement of a reference pixels according to the first embodiment.

On the other hand, as shown in FIG. 11, in the first embodiment, the reference pixel row 20 is arranged at every five rows (at four-row interval) within the image area. Therefore, a distance between the valid pixels 1 and the reference pixels 2 is equal to or smaller than two times the pixel pitch, and a variation of distances between the valid pixels 1 and the reference pixels 2 is small. Accordingly, the reference pixels 2 can output reference signals by accurately reflecting temperatures of the valid pixels 1. Further, the reference pixels 2 can output reference signals corresponding to the temperature distribution of the semiconductor substrate 9. As explained above, because the reference pixels 2 are arranged near the valid pixels 1, influence of the temperature distribution of the semiconductor substrate 9 becomes small. As a result, the S/N is improved.

Figure 12:
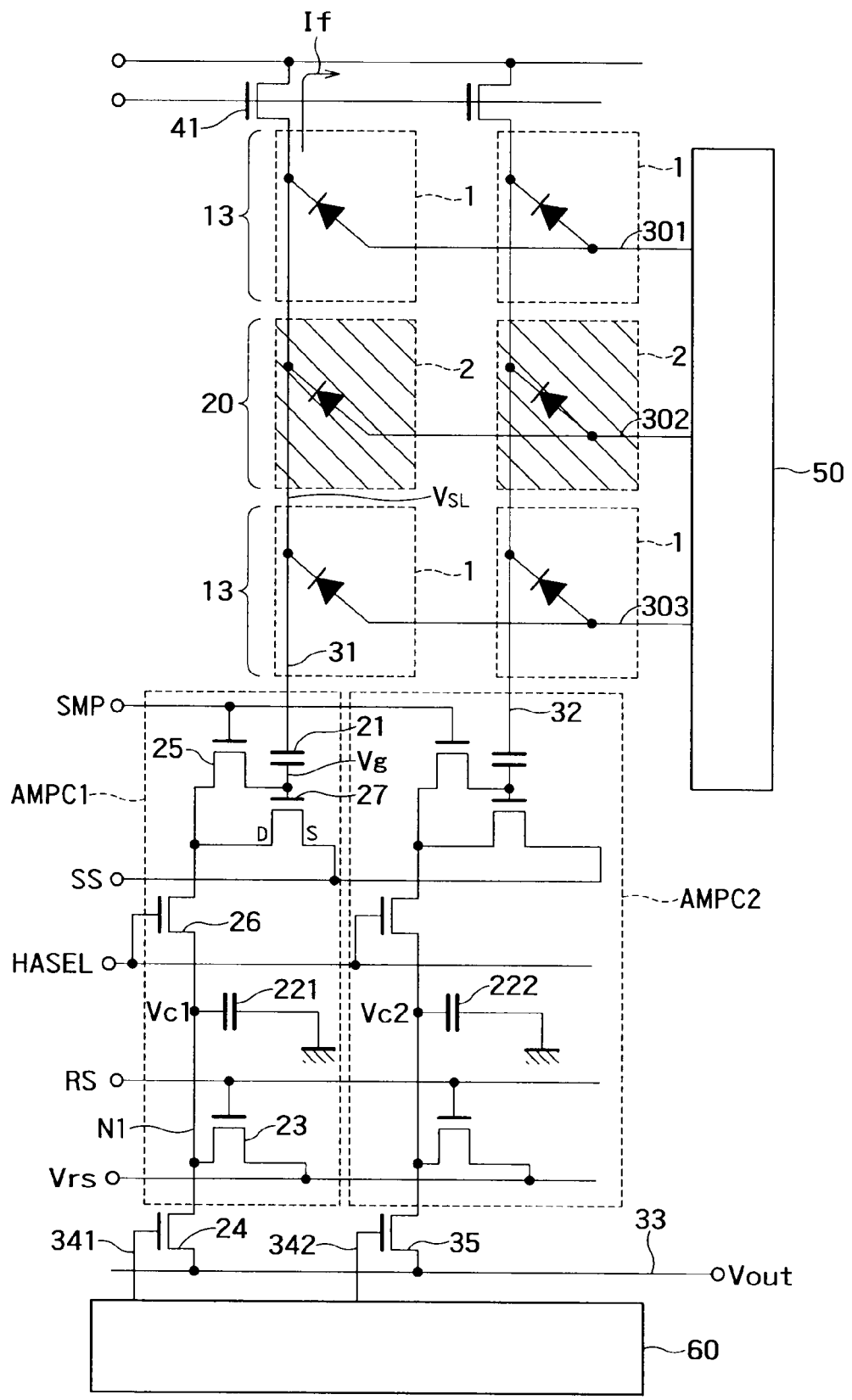
FIG. 12 is a circuit diagram showing an infrared sensor according to the first embodiment.

A method of reading data in the layout example 1 according to the first embodiment is explained. While FIG. 12 shows only six pixels arranged in three rows and two columns for the sake of convenience, more pixels can be included in the pixel region. A second row of the image area is the reference pixel row 20. A first row and a third row of the image area are the valid pixel rows 13.

Row selection lines 301 to 303 are connected to plural pixels arranged in a row direction. Vertical signal lines 31 and 32 are connected to plural pixels arranged in a column direction. The row selection lines 301 to 303 are connected to one end (an anode side) of a pn junction, and the vertical signal lines 31 and 32 are connected to the other end (a cathode side) of the pn junction.

The row selection lines 301 to 303 are connected to a row selection circuit 50. The row selection circuit 50 sequentially selects the reference pixel rows 20 and the valid pixel rows 13 via the row selection lines 301 to 303, and applies a bias voltage Vd to the selected pixel rows. In this case, a selection order of the row selection lines 301 to 303 can be optionally changed by changing a wiring layout of the row selection circuit 50. Therefore, the order of driving pulse signals does not need to be changed to change the selection order of the row selection lines 301 to 303. That is, selecting the reference pixel row 20 first can be easily achieved by changing the wiring layout. When the reference pixel row 20 is first selected, a read operation of the layout example 1 can be similar to an operation of a layout example shown in FIG. 10. That is, the sensor of the layout example 1 can achieve the operation by only changing the wiring layout without changing a peripheral control circuit.

The vertical signal lines 31 and 32 are connected to a load transistor 41. The load transistor 41 operates in a saturation region, and supplies a constant current to pixels of a selected row according to a gate voltage of this transistor. That is, the load transistor 41 works as a constant current source.

The vertical signal lines 31 and 32 are connected with amplifier circuits AMPC1 and AMPC2, respectively. The amplifier circuits AMPC1 and AMPC2 are configured to amplify signals obtained from the vertical signal lines 31 and 32.

When the row selection circuit 50 applies the bias voltage Vd to a pn junction of a selected row, the pn junction of the selected row is forward biased. Accordingly, a column voltage (Vd−Vref) obtained by subtracting a voltage drop Vref of the pn junction from the bias voltage Vd occurs in the vertical signal lines 31 and 32. On the other hand, because pn junctions of non-selected rows are all inversely biased, the row selection circuit 50 is isolated from the vertical signal lines 31 and 32. That is, the pn junctions have a pixel selection function.

When the valid pixel 1 receives an infrared ray, a pixel temperature rises. As a result, the voltage drop Vref decreases and the potential (Vd−Vref) of the vertical signal line 31 becomes high. When a temperature of an object changes by 1 K (Kelvin), for example, a temperature of the valid pixel 1 changes by about 5 mK. When thermoelectric conversion efficiency is 10 mV/K, a potential of the vertical signal line 31 increases by about 50 µV. This is much smaller than the bias voltage Vd. To amplify a signal of such a low voltage, an amplifier transistor is provided in each column. Because the amplifier circuits having a similar configuration are connected to the vertical signal lines 31 and 32, only a configuration of the amplifier circuit AMPC1 connected to the vertical signal line 31 is explained for the sake of convenience.

In the amplifier circuit AMPC1, a coupling capacitor 21 is connected between a gate of an amplifier transistor 27 and the vertical signal line 31. The coupling capacitor 21 DC isolates the gate of the amplifier transistor 27 from the vertical signal line 31. A sampling transistor 25 is connected between the gate and a drain of the amplifier transistor 27. The drain of the amplifier transistor 27 is connected to a node N1 via a switch transistor 26. A storage capacitor 221 is connected between the node N1 and a ground. The node N1 is also connected to a reading line 33 via a reading transistor 24. A gate of the reading transistor 24 is connected to a reading circuit 60 via a wiring 341. A reset transistor 23 is connected between a reset voltage Vrs and a first electrode of the storage capacitor 221. A gate of the reset transistor 23 is connected to a reset signal RS.

A gate voltage Vg of the amplifier transistor 27 increases according to an increase of a voltage of the vertical signal line 31. As a result, an amplification current flows between a source and the drain of the amplifier transistor 27. The storage capacitor 221 integrates a current amplified by the amplifier transistor 27. A signal voltage Vc1 is generated in the node N1 by a charge integrated by the storage capacitor 221. The signal voltage Vc1 is output as an output voltage Vout via the reading line 33 when the reading circuit 60 selects the reading transistor 24. The reading circuit 60 is configured to sequentially select the amplifier circuits AMPC1 and AMPC2. Accordingly, the infrared image sensor can sequentially read the signal voltage Vc1 and a signal voltage Vc2 as the output voltage Vout.

Figure 13:
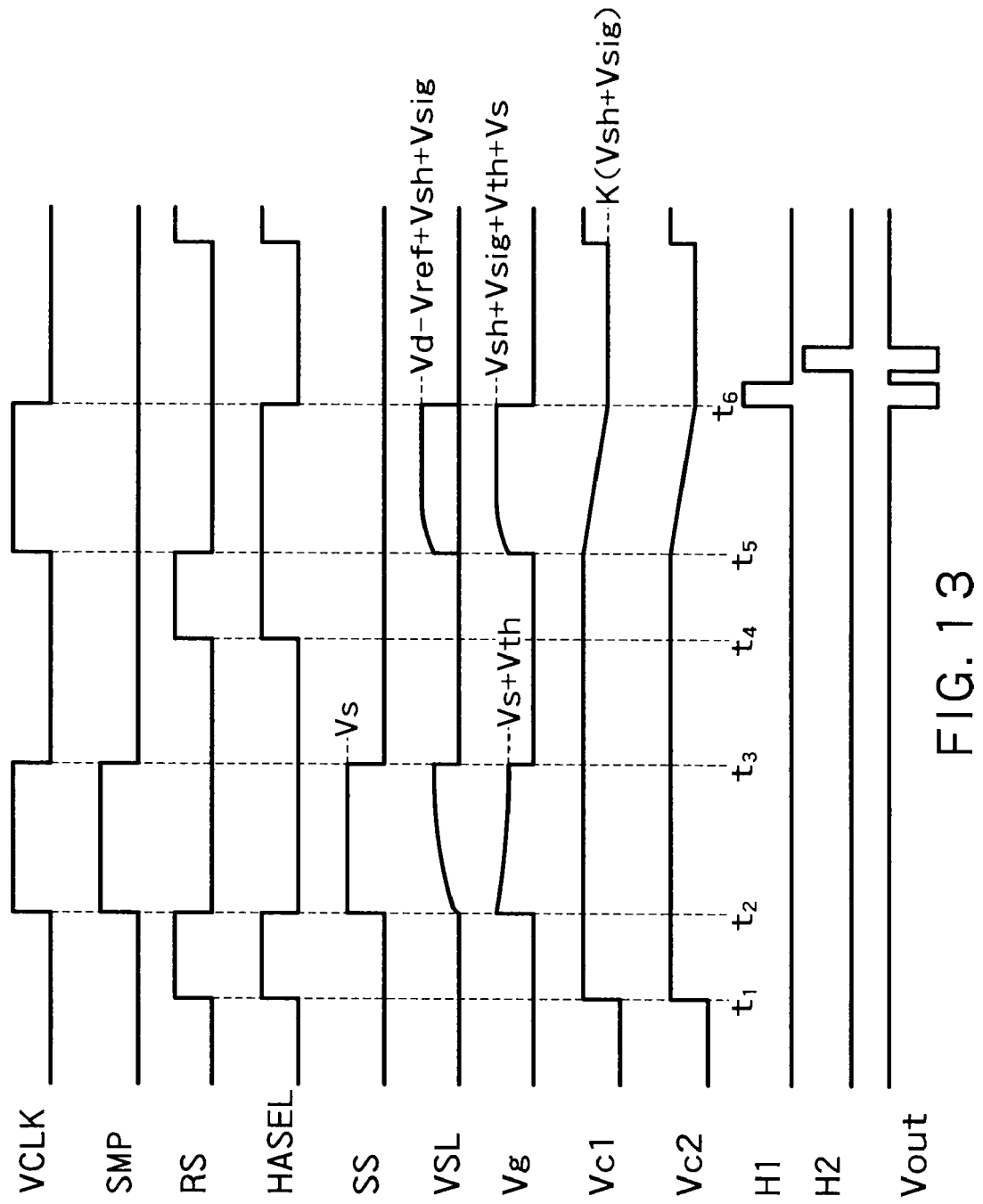
FIG. 13 is a timing chart showing an operation of the infrared sensor according to the first embodiment.

First, as shown in FIG. 13, a reset operation is performed during t1 and t2. In the reset operation, a signal RS is started, and the reset transistor 23 shown in FIG. 12 is turned on. The reset transistor 23 sets conductive the reset voltage Vrs and the node N1. At this time, a signal HASEL is also started, and the switch transistor 26 is turned on. The switch transistor 26 sets conductive the node N1 and the drain of the amplifier transistor 27. As a result, potentials of the node N1 and the drain of the amplifier transistor 27 are set to the reset voltage Vrs. The storage capacitor 221 accumulates a reset charge according to the reset voltage Vrs. A series of this operation during t1 and t2 is hereinafter called "reset operation".

The sensor detects a signal from the signal line 31 based on a state after the reset operation. The reset operation is simultaneously performed to the amplifier circuits AMPC1 and AMPC2. Voltages of the storage capacitors 221 and 222 are Vc1 and Vc2, respectively.

At t2, when the reset transistor 23 and the switch transistor 26 are turned off, the drain of the amplifier transistor 27 becomes in a buoyant state. At this time, a signal SMP is started, and the sampling transistor 25 is turned on. The sampling transistor 25 sets conductive the drain and the gate of the amplifier transistor 27. As a result, the drain and the gate of the amplifier transistor 27 become at the same potential. At the same time, a source potential of the amplifier transistor 27 is increased to Vs. Further, at t2, a signal VCLK is started, and the row selection circuit 50 shown in FIG. 12 applies the bias voltage Vd to a row selection line 302. That is, during a first selection period from t2 to t3, the row selection circuit 50 selects the reference pixel row 20.

Accordingly, during the first selection period from t2 to t3, a voltage VSL of the vertical signal line 31 gradually increases, and the gate voltage Vg of the amplifier transistor 27 gradually falls. These operations are performed for the following reasons. Because the gate and the drain of the amplifier transistor 27 are at the same potential, a current flows from the drain to the source until the gate voltage Vg (drain voltage) becomes equal to the source voltage. The amplifier transistor 27 operates in a saturation region from a relationship of Vdrain=Vg>Vg−Vth. When the drain voltage Vdrain and the gate voltage Vg of the amplifier transistor 27 become equal to a threshold value Vs+Vth, the current between the source and the drain of the amplifier transistor 27 stops.

A current flowing between the source and the drain of the amplifier transistor 27 is proportional to $(Vg-(Vs+Vth))^2$. Therefore, this current decreases when the gate voltage Vg comes nearer the threshold value Vs+Vth. Accordingly, when time shifts from t2 to t3, the gate voltage Vg gradually becomes closer to the threshold value Vs+Vth. In the first embodiment, a negative charge is supplied to the gate electrode of the amplifier transistor 27.

When a forward voltage of the reference pixel 2 according to a constant current If is Vref, the voltage VSL of the vertical signal line 31 becomes Vd−Vref when the sample transistor 25 is in the off state. The reference pixel 2 doe not include a self heating component Vsh and an infrared signal component Vsig. The self heating component Vsh is a voltage component reflecting a self heating due to Joule heating. The infrared signal component Vsig is a voltage component based on a temperature increase due to absorption of an incident infrared ray.

When the sample transistor 25 is in the on state, the voltage VSL of the vertical signal line 31 is suppressed to a voltage defined by a sum of the gate voltage Vg of the amplifier transistor 27 and a voltage Vcc of the coupling capacitor 21. Therefore, when capacitance of the coupling capacitor 21 is Ccc and also when a charge amount accumulated in the gate of the amplifier transistor 27 is Qg, VSL=Vd−Vref and Vg=Vth+Vs are established for the first time when the Expression 1 is established. That is, when a negative charge is accumulated in the gate of the amplifier transistor 27 and when Expression 2 shown below is established, a current between the source and the drain of the amplifier transistor 27 stops.

$$Qg=-(Vd-Vref-Vth-Vs)/Ccc \quad \text{(Expression 2)}$$

In this case, "−(Vd−Vref−Vth−Vs)" in the Expression 2 represents a change amount ΔVg of the gate voltage Vg during the first selection period from t2 to t3.

As described above, when the gate voltage Vg comes nearer the threshold value Vs+Vth, current driving capacity of the amplifier transistor 27 gradually decreases. Therefore, when the first selection period from t2 to t4 is short, a negative charge cannot be sufficiently accumulated in the gate of the amplifier transistor 27, and the Expression 2 cannot be satisfied. Accordingly, the first selection period from t2 to t3 is set to a long period so that the gate voltage Vg becomes substantially equal to the threshold value Vs+Vth. The first selection period from t2 to t3 is described later.

After the first selection period, the signal SMP is started, and the sampling transistor 25 is turned off. Accordingly, the gate of the amplifier transistor 27 becomes in a buoyant state while satisfying the Expression 2.

Next, during a period from t4 to t5, a reset operation is performed, and a drain voltage of the amplifier transistor 27 is set to the reset voltage Vrs again.

During a second selection period from t5 to t6, the row selection circuit 50 applies the bias voltage Vd to the valid pixel row 1. Accordingly, a forward voltage (Vref−Vsh−Vsig) is applied to the pn junction of the valid pixel 1. Because the valid pixel 1 has a higher temperature by temperatures corresponding to the self heating component Vsh and the infrared signal component Vsig, a voltage lower than Vref by (Vsh+Vsig) is applied to the pn junction. Therefore, the voltage VSL of the vertical signal line 31 becomes VSL=Vd−Vref+Vsh+Vsig. The gate voltage Vg of the amplifier transistor 27 becomes Vg=(Vd−Vref+Vsh+Vsig)−(Vd−Vref−Vth−Vs)=Vsh+Vsig+Vth+Vs. That is, the gate voltage Vg becomes a voltage obtained by adding the self heating component Vsh and the infrared signal component Vsig to the threshold value Vth+Vs.

A current Ids flowing between the source and the drain of the amplifier transistor 27 is proportional to $(Vg-Vth)^2=(Vsh+Vsig+Vs)^2$. The current Ids can be controlled by changing the source voltage Vs.

During the second selection period from t5 to t6, because the signal HASEL is started, the switch transistor 26 is in the on state. Therefore, when the gate voltage Vg changes from the threshold value Vs+Vth, the storage capacitor 221 accumulates a charge based on this change amount. During the second selection period from t5 to t6, the gate voltage Vg changes from the threshold value Vs+Vth by Vsh+Vsig. Therefore, the storage capacitor 221 accumulates a charge amount obtained by amplifying only the self heating component Vsh and the infrared signal component Vsig based on a charge amount after the reset operation. Based on a change of the charge amount within the storage capacitor 221, the voltage Vc1 of the node N1 changes by only a voltage obtained by amplifying (Vsh+Vsig) based on a potential after the reset operation.

Because the amplifier circuit AMPC2 also operates in a similar manner to that of the amplifier circuit AMPC1, the voltage Vc2 of the node N2 changes by only a voltage obtained by amplifying (Vsh+Vsig) based on a potential after the reset operation.

Signals H1 and H2 represent voltages applied to the gate 341 of the reading transistor 24 and a gate 342 of a reading transistor 35. When the reading circuit 60 outputs the signals H1 and H2 at different timings, the reading transistors 24 and 35 are sequentially turned on. As a result, the voltage Vc1 of the node N1 and the voltage Vc2 of the node N2 are sequentially read out as the output voltage Vout.

In the first embodiment, a Peltier device conventionally required to stabilize a substrate temperature and a shutter (fixed pattern removal) operation during an imaging in a camera circuit are not required.

Next, a method of correcting an image of the reference pixel 2 is explained. The output signal Vout from the reference pixel 2 is a voltage signal or a current signal reflecting a temperature of the semiconductor substrate. Therefore, the image needs to be corrected by referencing an output signal according to an infrared ray from the valid pixels 1 arranged at the periphery. For the image correction, there are a method of averaging the outputs of the valid pixels 1 at the periphery as used for a general image sensor, and a correction method considering a weight coefficient according to a positional relationship between the reference pixels 2 and the valid pixels 1.

As explained above, the first embodiment can provide an infrared image sensor capable of simplifying a process conventionally required, and having a smaller influence of a change of a semiconductor substrate temperature becoming a noise component of an infrared signal.

Second Embodiment

Layout Example 2 of Reference Pixels 2

Figure 14:
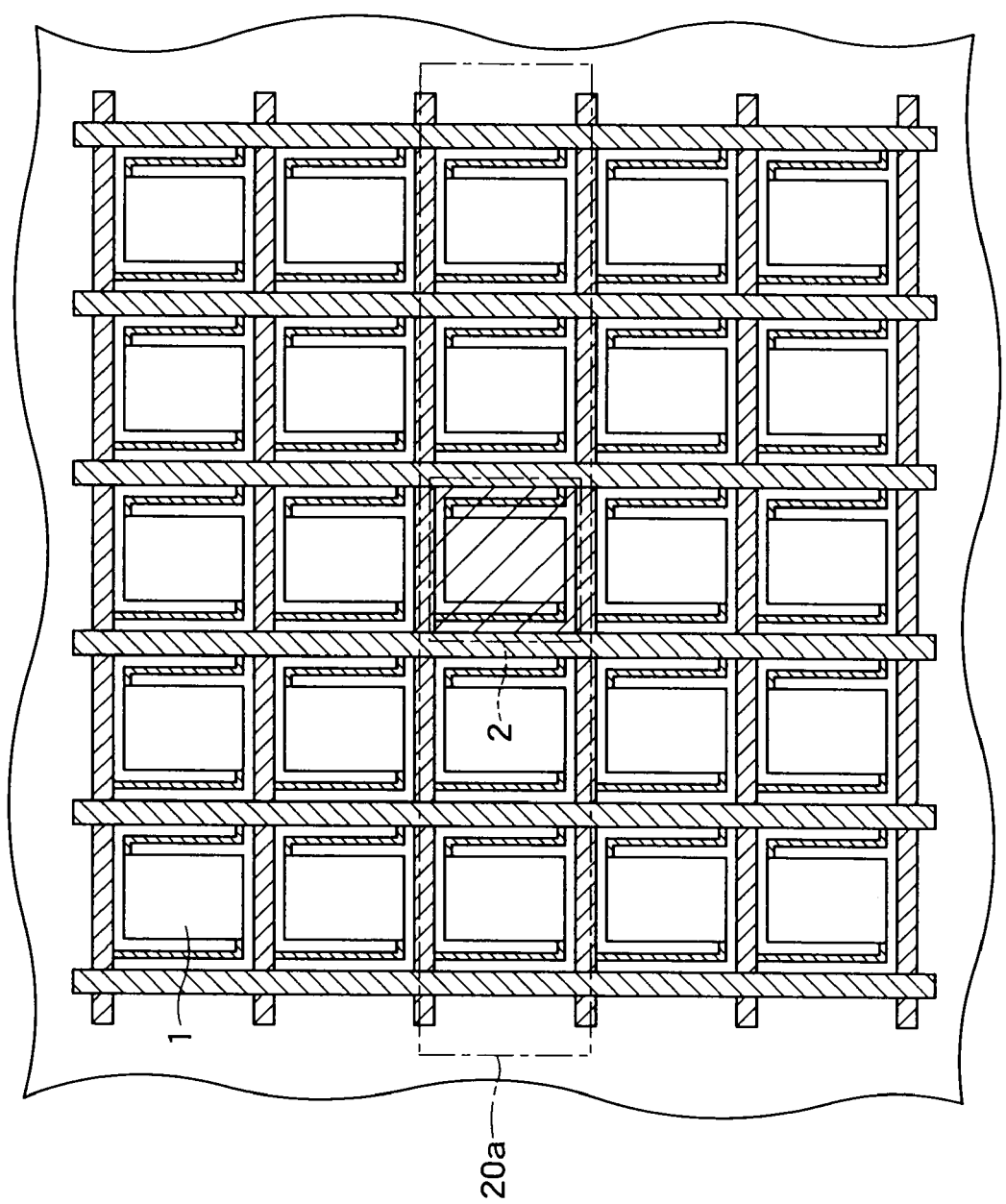
FIG. 14 is a plane view showing an infrared image sensor according to a second embodiment.
Figure 15:
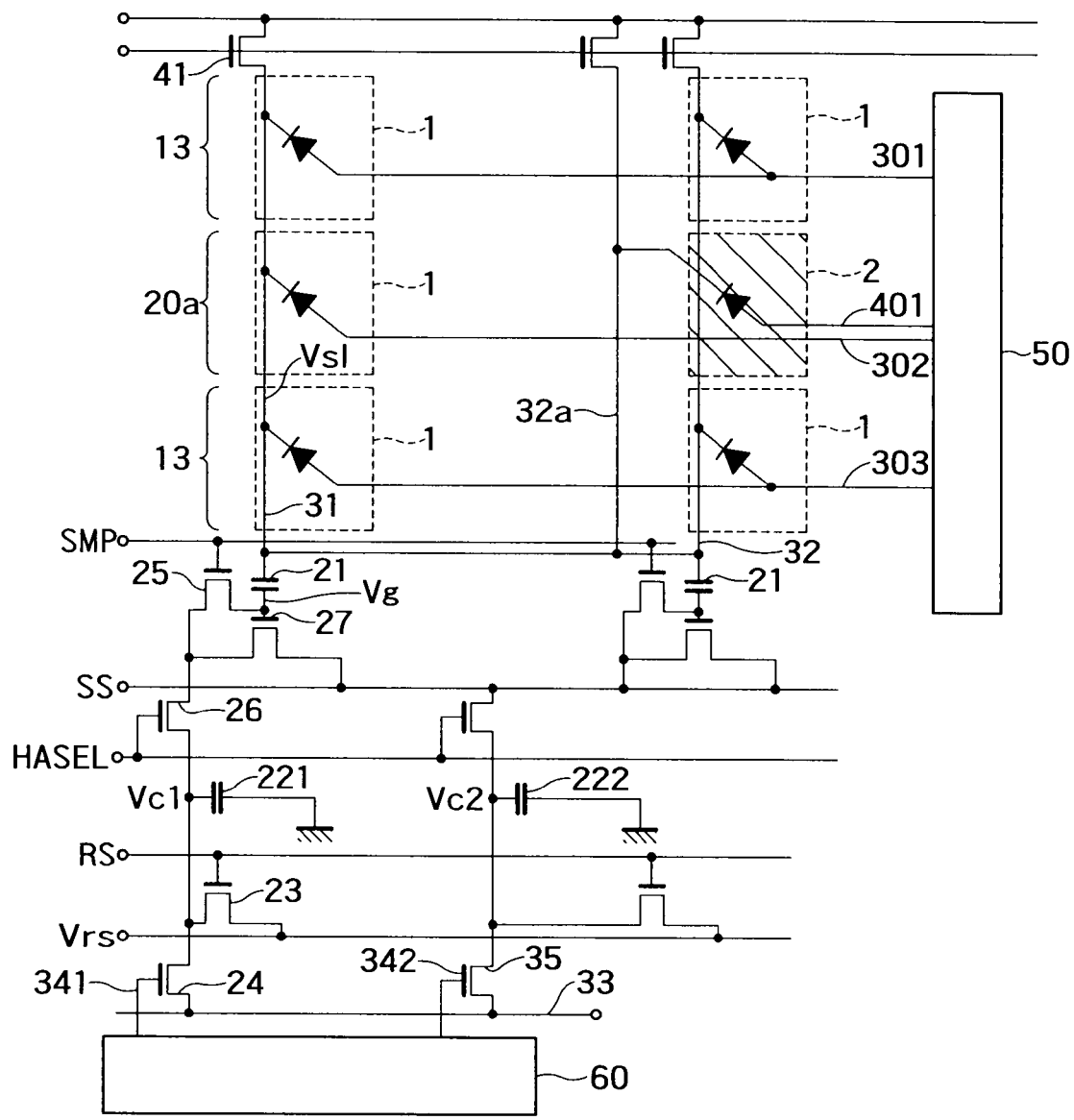
FIG. 15 is a circuit diagram showing an infrared sensor according to the second embodiment.

As shown in FIG. 14 and FIG. 15, in a layout example 2 according to a second embodiment of the present invention, the reference pixels 2 are laid out at a center position of an image area of five rows and five columns, for example. Remaining pixels include the valid pixels 1. A pixel row including the reference pixels 2 is a reference pixel row 20a.

Other configurations of the layout example 2 can be similar to those of the layout example 1. A method of manufacturing the layout example 2 can be also similar to that of the layout example 1. However, in the formation process of the etching holes 5, a mask pattern in the layout example 2 is different from that in the layout example 1.

A circuit configuration and a driving method of the layout example 2 are different from those of the layout example 1. More specifically, as shown in FIG. 15, the reference pixels 2 require a row selection line 401 and a vertical signal line 32a separately from the row selection line 302 and the vertical signal line 32 corresponding to the valid pixels 1. An anode of a pn junction of each reference pixel 2 is connected to the row selection line 401, and a cathode of the pn junction is connected to the vertical signal line 32a. Therefore, the row selection line and the vertical signal line are added to rows and columns where the reference pixels 2 are provided.

The vertical signal line 32a is connected to the coupling capacitor 21 of a column referencing the reference pixels 2. The row selection line 401 and the vertical signal line 32a can be provided in separate layers via the protection dielectric film 10, respectively for example, to minimize influence of regulated resistance and regulated capacitance. A read operation of an infrared signal from the valid pixels 1 is similar to the operation in the layout example 1. An image correction method can be performed using the valid pixels 1 at the periphery of the reference pixels 2. In the layout example 2, effects similar to those of the layout example 1 can be obtained.

The above embodiments of the present invention are not limited to as they are, and modified embodiments can be carried out at an implementation stage by changing constituent elements without departing from the scope of the invention. Furthermore, various inventions can be created by suitable combinations of the constituent elements disclosed in the above embodiments. For example, some of the whole constituent elements disclosed in the embodiments can be omitted, and the constituent elements according to different embodiments can be suitably combined with each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. An image sensor comprising:
a semiconductor substrate;
first pixels laid out above cavities provided within the semiconductor substrate, the first pixels converting thermal energy generated by incident light into an electric signal;
supporting parts connected between the first pixels and the semiconductor substrate, the supporting parts supporting the first pixels above the cavities; and
second pixels fixedly provided on the semiconductor substrate without the cavities, wherein
a plurality of the first pixels and a plurality of the second pixels are laid out two-dimensionally to form a pixel region, and
each of the second pixels is adjacent to the first pixels and is arranged within the pixel region.

2. The sensor according to claim 1, wherein the second pixels are provided at an inner side than an end of the pixel region.

3. The sensor according to claim 2, wherein the second pixels are thermal black elements converting a temperature of the semiconductor substrate into an electric signal.

4. The sensor according to claim 1, wherein the second pixels are laid out scatteringly within the pixel region.

5. The sensor according to claim 3, wherein the second pixels are thermal black elements converting a temperature of the semiconductor substrate into an electric signal.

6. The sensor according to claim 1, wherein the second pixels are laid out in a line shape within a plane of the pixel region.

7. The sensor according to claim 1, wherein all pixels adjacent to the second pixels are the first pixels.

8. The sensor according to claim 1, wherein the second pixels are thermal black elements converting a temperature of the semiconductor substrate into an electric signal.

9. The sensor according to claim 1, wherein the first pixels and the second pixels include: an infrared absorbing part absorbing an infrared ray and converting the infrared ray into thermal energy; and
a thermoelectric converting part connected to the infrared absorbing part and converting heat of the infrared absorbing part into an electric signal.

10. The sensor according to claim 1, wherein the first pixels and the second pixels are different from each other in that the pixels are laid out above the cavities or are laid out on the semiconductor substrate, and
other configurations of the first pixels and the second pixels are the same.

11. A method of manufacturing an image sensor, the image sensor including first pixels laid out above cavities provided within a semiconductor substrate, and converting thermal energy generated by an incident light into an electric signal, and second pixels having the same configuration as that of the first pixels and fixedly set on the semiconductor substrate, the method comprising:
forming thermoelectric converting parts converting thermal energy contained in the first and second pixels into an electric signal in such a manner that the thermoelectric converting parts are embedded into a dielectric film formed on the semiconductor substrate;
forming first etching holes at both sides of the thermoelectric converting parts of the first pixels, and simultaneously forming second etching holes at both sides of the thermoelectric converting parts of the second pixels; and
forming the cavities below the first pixels while keeping the second pixels set on the semiconductor substrate, by using isotropically etching the semiconductor substrate via the first and second etching holes, wherein
an interval L2 between two of the second etching holes at both sides of the thermoelectric converting part is larger than an interval L1 between two of the first etching holes at both sides of the thermoelectric converting part.

12. The method according to claim 11, wherein in etching the semiconductor substrate, a distance of the semiconductor substrate etched in a parallel direction to a front surface of the semiconductor substrate is larger than $(L1)*1/2$ and smaller than $(L2)*\frac{1}{2}$.

13. The method according to claim 12, wherein the image sensor further includes supporting parts connected between the first pixels and the semiconductor substrate, the supporting parts supporting the first pixels above the cavities, and
the supporting parts are patterned simultaneously with a formation of the etching holes.

14. The method according to claim 11, wherein the image sensor further includes supporting parts connected between the first pixels and the semiconductor substrate, the supporting parts supporting the first pixels above the cavities, and
the supporting parts are patterned simultaneously with a formation of the etching holes.

15. The method according to claim 11, wherein the cavities formed from two of the first etching holes at both sides of the thermoelectric converting part are connected to each other by isotropic etching of the semiconductor substrate, and
the cavities formed from two of the second etching holes at both sides of the thermoelectric converting part are not connected to each other by isotropic etching of the semiconductor substrate.

* * * * *